(12) United States Patent
Ha et al.

(10) Patent No.: US 10,756,045 B2
(45) Date of Patent: Aug. 25, 2020

(54) CONNECTING DEVICE AND CIRCUIT CHIP CONNECTING METHOD USING CONNECTING DEVICE

(71) Applicant: Samsung Display Co., Ltd., Yongin-si, Gyeonggi-do (KR)

(72) Inventors: Seung Hwa Ha, Yongin-si (KR); Seung Soo Ryu, Yongin-si (KR); Jeong Ho Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 12 days.

(21) Appl. No.: 15/878,835

(22) Filed: Jan. 24, 2018

(65) Prior Publication Data

US 2018/0211933 A1  Jul. 26, 2018

(30) Foreign Application Priority Data

Jan. 24, 2017  (KR) .................. 10-2017-0011243

(51) Int. Cl.
  *H01L 21/683* (2006.01)
  *H01L 23/00* (2006.01)
  *H01L 21/67* (2006.01)

(52) U.S. Cl.
  CPC ........ *H01L 24/75* (2013.01); *H01L 21/67092* (2013.01); *H01L 21/67144* (2013.01); *H01L 21/6838* (2013.01); *H01L 24/81* (2013.01); *H01L 24/16* (2013.01); *H01L 2224/16227* (2013.01); *H01L 2224/75102* (2013.01);
  (Continued)

(58) Field of Classification Search
  CPC ................ H01L 24/75; H01L 21/6838; H01L 2224/75102; H01L 2224/75252; H01L 2224/75353; H01L 2224/8109
  See application file for complete search history.

(56) References Cited

U.S. PATENT DOCUMENTS 6,116,490 A * 9/2000 Suzuki ................. B23K 20/106
                                                         228/1.1
6,460,591 B1 * 10/2002 Gotoh ..................... H01L 24/75
                                                          156/359
(Continued)

FOREIGN PATENT DOCUMENTS

KR       10-0989375 B1     10/2010
KR    10-2015-0023398 A     3/2015

OTHER PUBLICATIONS

Avio; "Rib Shape and Knurling of Horn"; http://www.avio.co.jp/english/products/assem/principle/ultrasonic/rib.html; downloaded Jan. 23, 2018; 1pg.
(Continued)

*Primary Examiner* — Latanya N Crawford
(74) *Attorney, Agent, or Firm* — Lewis Roca Rothgerber Christie LLP

(57) ABSTRACT

A connecting device for connecting a circuit chip to a substrate is provided. The connecting device includes: a main body having a first opening and a second opening; a vibration part on the main body, the vibration part being configured to vibrate the main body; and an intake part coupled with the first and second openings to adsorb the circuit chip to the main body. Both the first and second openings are open at a surface of the main body to which the circuit chip is adsorbed, and the second opening is arranged in the first opening on a plane.

13 Claims, 4 Drawing Sheets

(52) U.S. Cl.
CPC ............... *H01L 2224/75252* (2013.01); *H01L 2224/75353* (2013.01); *H01L 2224/8109* (2013.01); *H01L 2224/81191* (2013.01); *H01L 2224/81205* (2013.01); *H01L 2924/14* (2013.01); *H01L 2924/1426* (2013.01); *H01L 2924/20301* (2013.01); *H01L 2924/20302* (2013.01); *H01L 2924/20303* (2013.01); *H01L 2924/20304* (2013.01); *H01L 2924/20305* (2013.01); *H01L 2924/20306* (2013.01); *H01L 2924/20307* (2013.01); *H01L 2924/20308* (2013.01); *H01L 2924/20309* (2013.01)

(56) References Cited

U.S. PATENT DOCUMENTS

| | | | | |
|---|---|---|---|---|
| 6,491,785 | B1* | 12/2002 | Sato | B23K 20/10 156/358 |
| 2003/0037400 | A1* | 2/2003 | Hunter | B08B 7/00 15/306.1 |
| 2005/0241143 | A1* | 11/2005 | Mizuno | H01L 24/81 29/739 |
| 2009/0155953 | A1* | 6/2009 | Saeki | H01L 24/75 438/106 |
| 2010/0219229 | A1* | 9/2010 | Fujita | H01L 24/75 228/110.1 |
| 2013/0189894 | A1* | 7/2013 | Ueda | H01J 9/241 445/24 |
| 2014/0069989 | A1* | 3/2014 | Masumoto | H01L 21/50 228/180.22 |
| 2015/0086301 | A1 | 3/2015 | Rogers et al. | |
| 2016/0190087 | A1* | 6/2016 | Yu | H01L 24/75 156/379.6 |
| 2016/0244194 | A9 | 8/2016 | Hull | |
| 2018/0019223 | A1* | 1/2018 | Terada | H01L 24/92 |

OTHER PUBLICATIONS

Branson; "Ultrasonic horn catalog"; Emerson Industrial Automation; created Jul. 24, 2014; 28pp.

Dukane; "Ultrasonic Tooling—Horns/Fixtures"; http://www.dukane.com/us/PPL_horns.htm; downloaded Jan. 23, 2018; 1pg.

Ecosonic; "Principle of Ultrasonic Welding"; http://www.ecosonic.co.kr; downloaded Jan. 23, 2018; including partial Eng. translation, 2pp.

\* cited by examiner

CONNECTING DEVICE AND CIRCUIT CHIP CONNECTING METHOD USING CONNECTING DEVICE

CROSS-REFERENCE TO RELATED APPLICATION

This application claims priority to and the benefit of Korean Patent Application No. 10-2017-0011243, filed on Jan. 24, 2017 in the Korean Intellectual Property Office, the entire disclosure of which is incorporated herein by reference.

BACKGROUND

1. Field

Aspects of embodiments of the present disclosure relate to a connecting device for connecting a circuit chip to a substrate and a circuit chip connecting method using the connecting device.

2. Description of Related Art

Recently, demand for various types of display devices has increased. Flexible display devices have recently increased in demand. A flexible display is a display device that is designed to provide the same or substantially the same image quality even when it is folded or bent. In order to provide a flexible display device, it is important to have stable electrical connection between circuits.

Generally, an anisotropic conductive film has been used to provide a stable electrical connection between the circuits. The anisotropic conductive film is located between a bump of a circuit end and a pad to electrically connect the bump and the pad to each other. The anisotropic conductive film includes electrically-conductive particles that include a polymer and an electric conductor. Because the polymer of the electrically-conductive particles is elastic, the conductive particles are elastic. Therefore, even when a circuit moves close to or away from another circuit due to an external force, the conductive particles maintain the electrical connection between the circuits while compressing and expanding.

SUMMARY

Various embodiments of the present disclosure are directed to a connecting device for connecting various types of circuit chips to a substrate and to a circuit chip connecting method using the connecting device.

One embodiment of the present disclosure provides a connecting device for connecting a circuit chip to a substrate. The connecting device includes: a main body having a first opening and a second opening; a vibration part on the main body, the vibration part being configured to vibrate the main body; and an intake part coupled with the first and second openings to adsorb the circuit chip to the main body. Both the first and second openings are open at a surface to which the circuit chip is adsorbed, and the second opening is arranged in the first opening on a plane.

The first opening may have a smaller surface area than that of the circuit chip.

The first opening may have the same shape as that of the circuit chip.

The first opening may have a major axis and a minor axis, and, when the circuit chip is adsorbed to the main body, a major axis of the circuit chip may be parallel to the major axis of the first opening.

The second opening may have a smaller area than that of the first opening.

A plurality of the second openings may be in the first opening.

The first opening may have a major axis and a minor axis, and ones of the plurality of the second openings may be arranged along the major axis of the first opening.

A number of the second openings may be in a range from one to fifteen.

The second opening may extend along the main body to be coupled with the intake part.

A depth of the second opening may be greater than a depth of the first opening.

The vibration part may be configured to vibrate the main body in a vibration direction, and a depth direction of the first opening may be perpendicular to the vibration direction.

When the circuit chip is adsorbed to the main body, the second opening may be in a vacuum state due to suction from the intake part.

Another embodiment of the present disclosure provides a method of connecting a circuit chip to a substrate. The method includes: sucking the circuit chip to adsorb the circuit chip onto a connecting device; moving the connecting device such that the circuit chip contacts a pad on the substrate; and vibrating the connecting device and the circuit chip to connect the circuit chip and the pad to each other.

The sucking of the circuit chip may further include adsorbing the circuit chip onto an adsorption surface of the connecting device. The connecting device may include: a main body having a first opening and a second opening open at the adsorption surface; a vibration part coupled to the main body; and an intake part in fluid communication with the first and second openings to adsorb the circuit chip to the main body. The second opening may be in the first opening, and the vibration part may be configured to vibrate the main body.

The vibrating of the connecting device may further include the vibration part vibrating the connecting device at a frequency in a range of about 20 KHz to about 200 MHz.

The sucking of the circuit chip may further include adsorbing the circuit chip onto the adsorption surface such that the first and second openings are directly adjacent to an area of the circuit chip that is different from a region at where a plurality of bumps are arranged on the circuit chip.

The vibrating of the connecting device may further include connecting the bumps of the circuit chip to a plurality of pads on the substrate.

The vibrating of the connecting device may further include vibrating the connecting device and the circuit chip in a direction parallel to the substrate.

Another embodiment of the present disclosure provides a connecting device for connecting a circuit chip to a substrate. The connecting device includes: a vacuum source; a transducer configured to vibrate at a predetermined frequency; and a horn coupled to the transducer to be vibrated by the transducer. The horn has an adsorption surface configured to contact the circuit chip, and the adsorption surface has a first opening therein in fluid communication with the vacuum source and a plurality of supplemental intake tubes arranged in the first opening and open at the adsorption surface. The supplemental intake tubes are in fluid communication with the vacuum source.

Openings of the supplemental intake tubes may be offset from the first opening at the adsorption surface in a direction perpendicular to a vibration direction of the transducer.

According to embodiments of the present disclosure, it is possible to connect various kinds of circuit chips to a substrate.

However, aspects and features of the present disclosure are not limited to the above-described aspects and features, and embodiments of the present disclosure can be variously changed without departing from the sprit and scope of the present disclosure.

DETAILED DESCRIPTION

Figure 1:
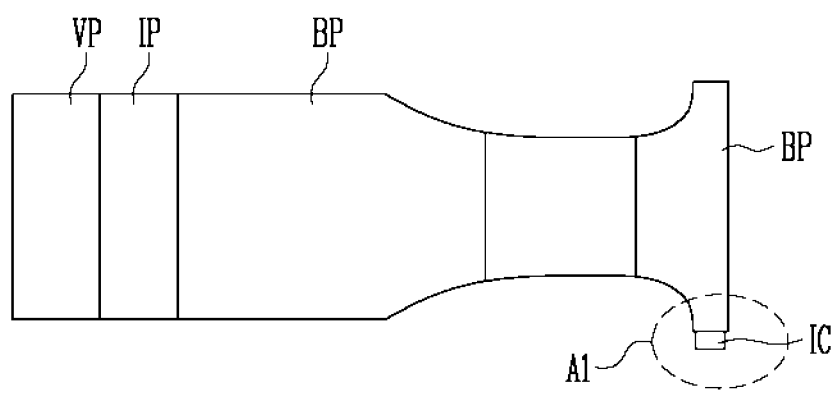
FIG. 1 is a side view of a connecting device and a circuit chip according to an embodiment of the present disclosure.

The present disclosure will be described more fully hereinafter with reference to the accompanying drawings, in which example embodiments of the present disclosure are shown. While certain example (or exemplary) embodiment of the present disclosure are described herein using specific terms, such descriptions are for illustrative purposes. It is to be understood that changes, equivalences, and substitutions may be made to embodiments of the present disclosure without departing from the spirit or scope of the appended claims and their equivalents.

Like reference numerals are used to identify like elements throughout different drawings. In the drawings, dimensions of structures may be exaggerated for clarity. Terms such as "first" and "second" may be used to describe various components, but these terms should not limit the various components. Those terms are used for the purpose of differentiating one component from other components. For example, a first component may be referred to as a second component, and a second component may be referred to as a first component and so forth without departing from the spirit and scope of the present disclosure.

The terminology used herein is for the purpose of describing particular example embodiments of the present invention and is not intended to be limiting of the described example embodiments of the present invention. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

A display device may include a display panel (or substrate) having a pixel thereon and a circuit chip electrically connected to a side of the display panel. The circuit chip may be a drive integrated circuit, for example. The drive integrated circuit may receive an input signal from outside and may transmit an output signal to the pixel of the display panel. In some embodiments, the input signal and the output signal may include a power voltage signal, an initialization voltage signal, a data voltage signal, a scan voltage signal, etc. In addition, the drive integrated circuit may be a data drive integrated circuit that may apply data voltage to a display region of the display panel, a scan drive integrated circuit that may apply scan voltage to the display region, or a combined drive integrated circuit that may combine data driving and scan driving.

The circuit chip and the display panel may be electrically connected to each other through a chip-on-glass (COG) method, a chip-on-film (COF) method, and the like. Generally, a bump provided on a surface of the circuit chip and a pad (e.g., a pad part or pad region) provided on a surface of the display panel are electrically connected to each other. Because the input signal and the output signal may be transmitted via a connection between the bump and the pad, stably connecting the bump and the pad ensures stable operation of the display device.

FIG. 1 is a side view of a connecting device and a circuit chip IC according to an embodiment of the present disclosure.

Referring to FIG. 1, the connecting device according to an embodiment of the present disclosure includes a main body BP to which a circuit chip IC is adsorbed (e.g., is closely adhered by a vacuum pressure), a vibration part (e.g., a vibrator or a transducer assembly) VP that is provided to (e.g., coupled to) the main body BP to vibrate the main body BP (e.g., to vibrate the main BP at a predetermined frequency), and an intake part (e.g., a vacuum source) IP that is coupled with (e.g., in fluid communication with) first and second openings to adsorb the circuit chip IC to the main body BP. Hereinafter, the various components or parts of the connecting device will be described in more detail.

The circuit chip IC may be adsorbed to the main body BP. Throughout this specification, the term "adsorption" and variations thereof mean that the circuit chip IC is temporarily attached to a surface of a portion of the main body BP. When the circuit chip IC is adsorbed to the main body BP, no chemical bond is formed between the main body BP and the circuit chip IC. Therefore, the main body BP and the circuit chip IC may be easily attached to and separated from each other. According to embodiments of the present disclosure, the first and second openings are at (e.g., open to) an adsorption surface GS at where the circuit chip IC is adsorbed to the main body BP. A vacuum may be created in the first opening and/or the second opening. The circuit chip IC may be adsorbed to the main body BP by the vacuum created in the opening(s). In this embodiment, the circuit chip IC may be separated from the main body BP by releasing the vacuum from the first and/or second openings.

The main body BP may be designed in consideration of a frequency and amplitude of the vibration generated by the vibration part VP. For example, the main body BP may be designed such that a resonance frequency of the main body BP matches the frequency of the vibration generated by the vibration part VP, so the vibration generated by the vibration part VP may be efficiently transmitted to the circuit chip IC. In FIG. 1, the main body BP is illustrated as being a bar horn. However, the shape of the main body BP shown in FIG. 1 is merely illustrative. Thus, the main body BP may be a stepped horn, a conical horn, an exponential horn, or a block horn as some examples.

The main body BP may include metal, metallic compounds, non-metallic inorganic compounds, and/or organic compounds. For example, the main body BP may contain oxides and/or nitrides of tungsten (W), copper (Cu), silver (Ag), gold (Au), platinum (Pt), aluminum (Al), iron (Fe), titanium (Ti), and gallium (Ga), halogen compounds, or combined alloys thereof. In some embodiments, the main body BP may contain non-metallic inorganic compounds, such as silicone (Si) compounds or organic polymers, such as polycarbonate. The adsorption surface GS at where the main body BP contacts the circuit chip IC may be polished. Therefore, the circuit chip IC may not be damaged by the adsorption surface GS of the main body BP. A planar area (or a surface area) of the main body BP at where the circuit chip IC is adsorbed to the main body BP (e.g., the adsorption surface GS) may be equal to or greater than that of the circuit chip IC. As such, uniform or substantially uniform pressure may be applied to the surfaces of the circuit chip IC by the main body BP.

The main body BP may further include a power supply (e.g., a power supply device) for supplying electric energy to the vibration part VP and/or to the intake part IP. The power supply is not limited, and any suitable power supply may be used. Furthermore, the power supply may be provided inside or outside the connecting device according to various embodiments of the present disclosure. When the power supply is provided outside the connecting device, the connecting device and the external power supply may be electrically connected to each other via a separate power line.

The vibration part VP may vibrate the connecting device and the circuit chip IC adsorbed to the connecting device at a predetermined frequency. The vibration part VP may vibrate by using a piezoelectric effect. The piezoelectric effect means that mechanical energy and electric energy are mutually converted via a piezoelectric element. For example, mechanical energy, such as vibrations, may be converted into electric energy via the piezoelectric element, and electric energy may be converted into mechanical energy in the form of vibrations via the piezoelectric element. The piezoelectric element for converting the electric energy into the mechanical energy, for example, vibratory energy, is referred to as a vibrator or transducer. The vibration part VP according to an embodiment of the present disclosure may include the above-described vibrator or transducer.

In addition, the vibration part VP may further include an amplifier or booster. The amplifier selectively increases and reduces the vibratory energy generated by the vibrator. Therefore, an increase/reduction ratio of the vibratory energy supplied by the amplifier (or booster) may be adjusted depending on the size and/or material of an object that is to be connected thereto.

The intake part IP is provided on a side of the main body BP. The intake part IP may be connected with (e.g., in fluid communication with) the first and second openings to adsorb the circuit chip IC to the main body BP. The intake part IP may create a vacuum in the first opening and/or the second opening. The intake part IP may suck (e.g., may pump via a vacuum) and discharge air or may suck and condense air in the opening(s) so as to create a vacuum in the opening(s). The intake part IP may include a vacuum pump to suck and discharge or to condense air.

The shapes of the main body BP, the intake part IP, and the vibration part VP are schematically shown in FIG. 1. The shape of the connecting device (e.g., the shapes of the components of the connecting device) may be different from those shown in FIG. 1, and those skilled in the art may conceive connecting devices (e.g., main bodies BP, intake parts IP, and vibration parts VP) having various suitable shapes different from those shown in FIG. 1.

Figure 2:
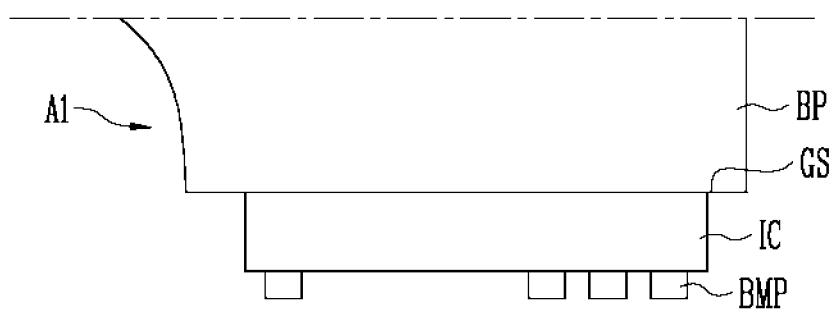
FIG. 2 is an enlarged side view of a part of the connecting device and the circuit chip indicated by A1 in FIG. 1.
Figure 3A:
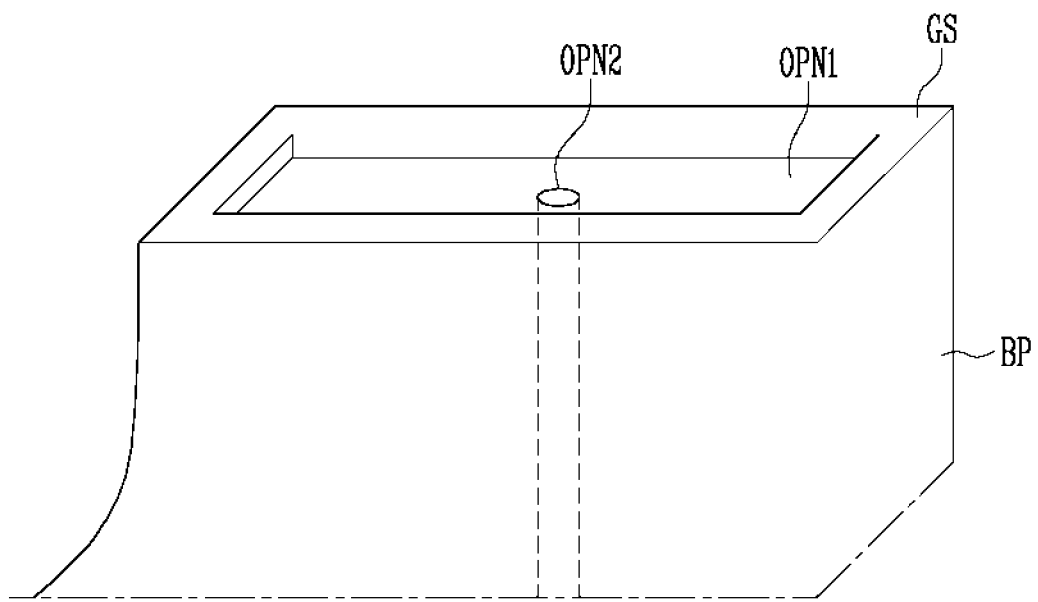
FIGS. 3A and 3B are perspective views of a part of the connecting device according to embodiments of the present disclosure.
Figure 3B:
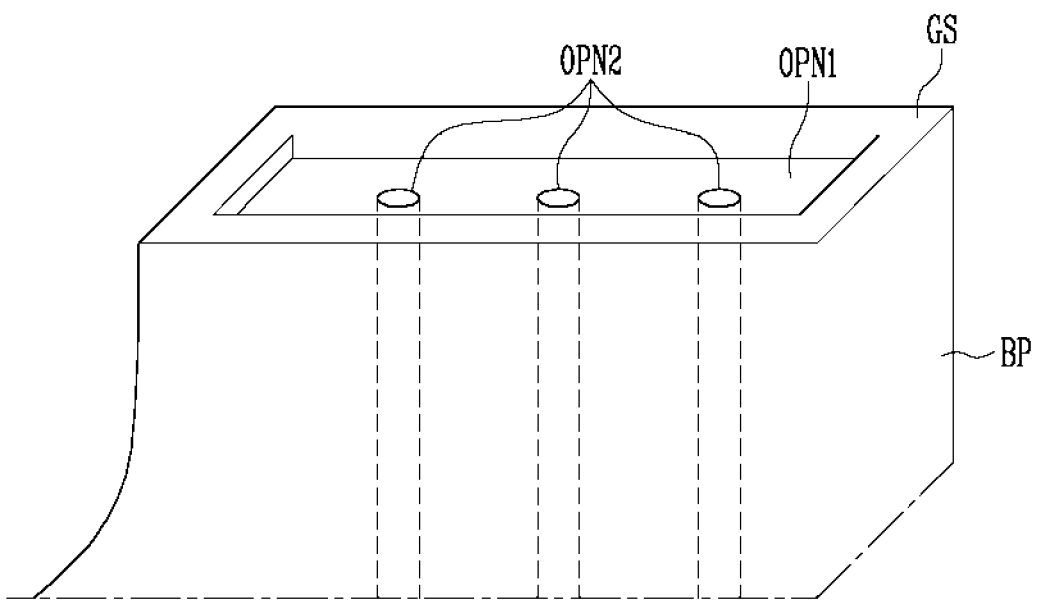

FIG. 2 is an enlarged side view of a part of the connecting device indicated by A1 in FIG. 1 in a state in which the circuit chip IC is adsorbed to the connecting device. FIGS. 3A and 3B are perspective views of a part of the connecting device according to embodiments of the present disclosure.

Hereinafter, the present disclosure will be described with reference to FIGS. 2, 3A, and 3B.

The circuit chip IC may have an oblong shape with a major axis and a minor axis. Herein, an oblong shape is a shape having a major axis and a minor axis. Therefore, an oblong shape is not limited to but may include a rectangle, all internal angles of which are 90 degrees. The oblong shape may also be a diamond shape, a trapezoid shape, an ellipse shape, or a semi-ellipse shape which has acute and/or obtuse internal angles. Therefore, the oblong circuit chip IC may have a rectangular shape, an elliptic shape, a trapezoidal shape, or a diamond shape. The circuit chip IC may have an elongated shape extending primarily in one direction (e.g., extending farther in one direction than in another direction crossing or perpendicular to the one direction) without being limited to a particular shape. For example, the oblong circuit chip IC may provide a display device having a relatively high resolution. A number of bumps BMP on the circuit chip IC is related to the resolution of the display device connected by the circuit chip IC. Generally, the number of bumps BMP is increased to increase the resolution of the display device. A square-shaped circuit chip IC is limited in the number of bumps BMP as the bumps BMP formed thereon are arranged along a periphery of the circuit chip IC. A relatively greater number of bumps BMP may be provided on an oblong-shaped circuit chip IC according to an embodiment of the present disclosure as the oblong-shaped circuit chip IC has bumps BMP arranged in a plurality of rows that are parallel to the major axis of the circuit chip IC. Thus, the oblong circuit chip IC may be used to provide a display device having a relatively high resolution.

As described above, the circuit chip IC may be a drive integrated circuit, for example. The drive integrated circuit may receive an input signal from outside and may transmit an output signal to the pixels of the display panel. The input signal and the output signal may include a power voltage signal, an initialization voltage signal, a data voltage signal, a scan voltage signal, etc. In addition, the drive integrated circuit may be a data drive integrated circuit that may apply data voltage to a display region of the display panel, a scan drive integrated circuit that may apply scan voltage to the display region, or a combined drive integrated circuit that may combine data driving and scan driving.

The circuit chip IC may include a plurality of layers. For example, the circuit chip IC may include a base layer including (or formed of) silicone and an insulator stacked on the base layer. The insulator may include (or may be made of) a flexible, heat-resistant material, such as polyimide (PI) or polyethylene terephthalate (PET).

The bumps BMP may include an input bump and an output bump. A plurality of output bumps and a plurality of input bumps may be provided on the circuit chip IC. The output signal may be transmitted through the output bump(s) to the pixels of the display panel. In addition, the input signal may be transmitted through the input bump(s). Each of the bumps BMP may include the insulator and a conducting layer surrounding the insulator. The insulator may include an elastic material to allow the circuit chip IC and the display panel to be stably connected to each other. Thus, even when a relative position between the circuit chip IC and the display panel changes, the connection between the circuit chip IC and the display panel may be stably maintained to some extent. The elastic material may be polyethylene (PE), polypropylene (PP), polystyrene (PS), polyvinyl chloride (PVC), polyester, polyurethane (PU), polyamide, polybutadiene, polyimide (PI), and other suitable materials without being limited to any specific material. Further, the conducting layer included in each of the bumps BMP may include a highly conductive material to electrically connect the circuit chip IC and the display panel to each other. The conducting layer may include a conductive material, such as metal, a conductive resin, or a resin-metal composite material. For example, the conducting layer may contain gold (Au), lead (Pb), copper (Cu), etc.

The first opening OPN1 and the second opening OPN2 (e.g., the supplemental intake tube) are provided at (e.g., open to) a surface (e.g., the adsorption surface GS) of the main body BP. For example, the first opening OPN1 and the second opening OPN2 are provided at a surface at where the circuit chip IC is adsorbed to the main body BP.

The first opening OPN1 may have an oblong shape having a major axis and a minor axis. For example, the first opening OPN1 may have a rectangular shape, an elliptical shape, a trapezoidal shape, or a diamond shape. The first opening OPN1 may have an elongated shape extending primarily in one direction without being limited to any specific shape, similar to the circuit chip IC.

Thus, the first opening OPN1 may have the same or substantially the same shape as the circuit chip IC. Here, the same shape does not limit the shape of the first opening OPN1 to being completely identical as the shape of the circuit chip IC. For example, the circuit chip IC and the first opening OPN1 may both have a rectangular shape but may be different from each other in a ratio of the major axis to the minor axis thereof. Because the first opening OPN1 has a shape similar to that of the circuit chip IC, an adsorbing force of the main body BP to the circuit chip IC may be enhanced.

When viewed on a plane (e.g., when viewed from above or top down), an area (e.g., an opening area) of the first opening OPN1 may be less than an area (e.g., a surface area) of the circuit chip IC. Thus, when the circuit chip IC is adsorbed (or sucked) to the main body BP, the circuit chip IC is not adsorbed into the first opening OPN1. The area of the first opening OPN1 may be determined in consideration of the area of the circuit chip IC without being limited to a specific area. For example, the area of the first opening OPN1 may be in a range from about 30% to about 80% of that of the circuit chip IC. If the area of the first opening OPN1 is less than about 30% of that of the circuit chip IC, a sufficient adsorbing force may not be provided to the circuit chip IC. If the area of the first opening OPN1 is greater than about 80% of that of the circuit chip IC, the first opening OPN1 may cover a region of the circuit chip IC at where the bumps are provided when the circuit chip IC is adsorbed. In this case, as will be described later, a connection between the circuit chip IC and the display panel may be negatively impacted.

When both the circuit chip IC and the first opening OPN1 have a major axis and a minor axis, the circuit chip IC may be adsorbed to the main body BP such that the major axis of the circuit chip IC is parallel to the major axis of the first opening OPN1 and the adsorbing force between the main body BP and the circuit chip IC may be enhanced.

When the circuit chip IC has the oblong shape with the major axis and the minor axis as described above, an adsorbing force between the main body BP and the circuit chip IC is improved. For example, when the circuit chip IC has the oblong shape, a greater adsorbing force may be necessary between the circuit chip IC and the main body BP in comparison to when a square-shaped circuit chip IC is provided. After the circuit chip IC is adsorbed to the main body BP, the main body BP and the circuit chip IC are vibrated by the vibration part VP. The greater adsorbing force may be necessary because slippage may occur between the main body BP and the circuit chip IC when the circuit chip IC has the oblong shape. For example, when the circuit chip IC has the oblong shape, a distance between the adsorption surface GS of the main body BP and an edge of the circuit chip IC is relatively large so that the amplitude of the main body BP may not match the amplitude of the circuit chip IC. In order to prevent or reduce slip of the circuit chip IC relative to the main body BP, increased adsorbing force should be applied between the circuit chip IC and the main body BP.

Referring to FIG. 2, the main body BP according to an embodiment of the present disclosure adsorbs the circuit chip IC. In the state in which the circuit chip IC is adsorbed to the main body BP, the first opening OPN1 and the second opening OPN2 are open at the adsorption surface GS of the circuit chip IC when viewed on a plane.

As described above, a vacuum may be created in the first opening OPN1 and/or the second opening OPN2 by the intake part IP. In an adsorbed state, pressure (e.g., atmospheric pressure) in the first opening OPN1 and/or the second opening OPN2 is lower than atmospheric pressure at an upper surface of the circuit chip IC. Due to a difference in pressure between the upper surface of the circuit chip IC and the interiors of the first and second openings OPN1 and OPN2, pressure directed towards the main body BP may act on the circuit chip IC. When the circuit chip IC is adsorbed to the main body BP by the pressure directed towards the main body BP, the adsorbing force acts between the circuit chip IC and the main body BR Thus, the difference in pressure between the upper surface of the circuit chip IC and the first and/or second opening OPN1 and OPN2 or the pressure directed towards the main body BP provides the adsorbing force between the circuit chip IC and the main body BP. Depending on the relative position between the main body BP and the circuit chip IC, the adsorbing force may be a difference between a force generated by the pressure directed towards the main body BP and gravity acting on the circuit chip IC.

As shown in FIGS. 3A and 3B, the second opening OPN2 is provided in the first opening OPN1 when viewed on a plane. Therefore, both of the first opening OPN1 and the second opening OPN2 are open at the adsorption surface GS. When viewed on the plane, the second opening OPN2 has a smaller area than the first opening OPN1. The second opening OPN2 is not limited to a specific shape. Therefore, the second opening OPN2 may have various suitable shapes different from the circular shape shown in FIGS. 3A and 3B, such as an ellipse, a square, a rectangle, a diamond, a semicircle, or a triangle. When the second opening OPN2 has a circular shape, a diameter of the second opening OPN2 may be in a range from about 0.5 mm to about 1.0 mm. If the diameter of the second opening OPN2 is less than about 0.5 mm, the adsorbing force between the main body BP and the circuit chip IC may be decreased. If the diameter of the second opening OPN2 is more than about 1.0 mm, it may be difficult to provide a plurality of the second openings OPN2 in the first opening OPN1 (see, e.g., FIG. 3B). Further, a size of a cavity in the main body BP may increase, and thereby, the reliability of the connecting device may be reduced as will be further described later.

A plurality of second openings OPN2 may be provided in the first opening OPN1. According to embodiments of the present disclosure, one to fifteen second openings OPN2 may be provided in the first opening OPN1. The second openings OPN2 extend along the main body and thereby are coupled with the intake part IP. Thus, the larger the second openings OPN2, the greater the adsorbing force between the main body BP and the circuit chip IC. However, if the number of the second openings OPN2 is more than 15, the reliability of the connecting device may be reduced. As described above, the main body BP receives vibration energy generated by the vibration part VP that is integral with the main body BP. The main body BP transmits the vibration energy from the vibration part VP through the adsorption surface GS to the circuit chip IC. If the main body BP is hollow, the efficiency of transmitting the vibration energy may be reduced. Therefore, if more than 15 second openings OPN2 are provided in the main body BP, the efficiency of transmitting the vibration energy may be reduced due to a size of an internal cavity of the main body BP caused by the second openings OPN2 extending through the main body BP to be coupled to the intake part IP. However, the number of the second openings OPN2 is not limited to the above-described example range.

A plurality of first openings OPN1 may be provided. A single or a plurality of second opening(s) OPN2 may be provided in each of the plurality of first openings OPN1. The same number of second openings OPN2 may be provided in each first opening OPN1 or a different number of second openings OPN2 may be provided in the different ones of the first openings OPN1.

When a plurality of second openings OPN2 is provided in the first opening OPN1, the second openings OPN2 may be arranged along the major axis of the first opening OPN1. For example, a row of the second openings OPN2 may extend parallel to the major axis of the first opening OPN1. Because the plurality of second openings OPN2 is arranged along the major axis of the first opening OPN1, the adsorbing force is evenly or substantially evenly transmitted throughout an entire region of the first opening OPN1.

The number of second openings OPN2 may be determined depending on the size of the first opening OPN1 and the size of the circuit chip IC. When the size of the circuit chip IC used in a connecting process is relatively small, the size of the first opening OPN1 may be relatively small. In this embodiment, even when only one second opening OPN2 is present in the first opening OPN1, sufficient adsorbing force may be provided to the entire region of the first opening OPN1. When the size of the circuit chip IC used in the connecting process is relatively large, the size of the first opening OPN1 may be relatively large. In this embodiment, a sufficient adsorbing force may be provided to the entire region of the first opening OPN1, for example, at an edge region of the first opening OPN1 along the major axis, using only one second opening OPN2 provided in the first opening OPN1. Insufficient adsorbing force at the end region of the first opening OPN1 along the major axis may cause slipping of the circuit chip IC relative to the main body BP. Thus, when the size of the circuit chip IC is relatively large, a sufficient adsorbing force may be provided to the entire region of the first opening OPN1 by providing the plurality of second openings OPN2 in the first opening OPN1.

FIG. 3B illustrates that the second openings OPN2 are arranged in one row. However, such an arrangement of the second openings OPN2 is merely illustrative. According to other embodiments, the second openings OPN2 may be arranged in a plurality of rows. The arrangement of the second openings OPN2 may vary depending on the shape and size of the circuit chip IC and of the first opening OPN1. For example, when the first opening OPN1 has an oblong shape and a length of the major axis is much larger than that of the minor axis, the plurality of second openings OPN2 may be arranged in one row. However, when the first opening OPN1 has the oblong shape and the length of the major axis is similar to that of the minor axis, the plurality of second openings OPN2 may be arranged in a plurality of rows. For example, the second openings OPN2 may be arranged to increase or maximize the adsorbing force between the main body BP and the circuit chip IC according to the shape of the first opening OPN1.

The second openings OPN2 extend along the main body BP. Thus, the second openings OPN2 may extend from the adsorption surface GS along the main body BP to be coupled with the intake part IP. As described above, the intake part IP may suck and discharge air or may suck and compress air in the second openings OPN2 so as to create a vacuum in the second openings OPN2. A depth of the second openings OPN2 may be greater than that of the first opening OPN1 (e.g., opening surfaces of the second openings OPN2 may be offset from an opening surface of the first opening OPN1 in a direction perpendicular to the vibration direction of the adsorption surface GS). Thus, the second openings OPN2 may have a relatively narrow and deep shape, and the first opening OPN1 may have a relatively wide and shallow shape. Because the first opening OPN1 has the relatively wide and shallow shape, it is possible to provide the adsorbing force to the circuit chip IC over a larger region (e.g., over a wide region). Further, the second opening OPN2 has the relatively narrow and deep shape to be coupled with the intake part IP.

When the second openings OPN2 extend along the main body BP, the size and/or shape of the second openings OPN2 may vary depending on a position in a depth direction of the second openings OPN2. For example, the second openings OPN2 may be the largest at the adsorption surface GS, and the size of the second openings OPN2 may decrease as the second openings OPN2 extend along the main body BP closer to the intake part IP, However, in other embodiments, the second openings OPN2 may be smallest at the adsorption surface GS, and the size of the second openings OPN2 may increase as the second openings OPN2 extend along the main body BP away from the intake part IP. The overall shape and size of the second openings OPN2 may be determined in consideration of the fluid behavior of the second openings OPN2 and the convenience of manufacture.

The main body BP according to an embodiment of the present disclosure includes the first opening OPN1 and the second opening OPN2 that overlap each other on a plane, thus providing sufficient adsorbing force between the circuit chip IC and the main body BP.

When the circuit chip IC has the oblong shape, it may be difficult to provide sufficient adsorbing force between the main body BP and the circuit chip IC using only one relatively small opening, like the second opening OPN2. Thus, in this case, when vibration is transmitted to the circuit chip IC, the circuit chip IC may slip relative to the main body BP. Further, the circuit chip IC may be tilted or rotated during the connecting process for the circuit chip IC due to torque acting on both sides of the oblong circuit chip IC. Such behavior of the circuit chip IC prevents the circuit chip IC from being connected to a desired position of the display panel, thus deteriorating the quality of the display device that is manufactured by using the connecting process.

In the case of providing only the plurality of second openings without the first opening, the adsorbing force may be reduced. Even when the adsorption surface GS of the main body BP that contacts the circuit chip IC is polished, the adsorption surface GS may include a fine uneven portion. Such an uneven portion obstructs the main body BP and the circuit chip IC from being in close contact with each other at the adsorption surface GS. For example, due to the uneven portion of the adsorption surface GS of the main body BP, leakage may occur at the adsorption surface GS. If air continues to flow into one or more of the second openings due to the leakage, the adsorbing force between the main body BP and the circuit chip IC may be reduced because the adsorbing force is affected by the vacuum created in the second openings and a difference in atmospheric pressure resulting from the vacuum as described above. If the air continues to flow into the second openings, a vacuum may not be created in the second openings and a difference in atmospheric pressure between the inside of the second openings and the outside thereof is reduced so that the adsorbing force is consequently reduced. In order to prevent leakage, a resin may be provided between the adsorption surface GS of the main body BP and the circuit chip IC. However, the resin may substantially reduce the efficiency of the connecting process using the vibration. According to embodiments of the present disclosure, the vibration of the main body BP is transmitted to the circuit chip IC. Thus, if a resin is provided between the main body BP and the circuit chip IC, it may compensate for the uneven portion of the adsorption surface GS of the main body BP and prevent leakage but may undesirably obstruct the vibration energy from being efficiently transmitted to the circuit chip IC, thereby reducing the efficiency of the connecting process.

The main body BP according to an embodiment of the present disclosure includes the first opening OPN1 and the second opening OPN2 that overlap each other on a plane. When the circuit chip IC has the oblong shape, the first opening OPN1 may have an oblong shape to prevent the circuit chip IC from slipping, rotating, or tilting. Further, because a vacuum chamber is formed at the first opening OPN1 over a relatively large region of the circuit chip IC, leakage caused by an uneven portion of the adsorption surface GS of the main body BP may be prevented or substantially mitigated. Because the main body BP according to an embodiment of the present disclosure mitigates a leakage problem, the main body BP may provide sufficient adsorbing force to the circuit chip IC without using a resin between the main body BP and the circuit chip IC.

Figure 4:
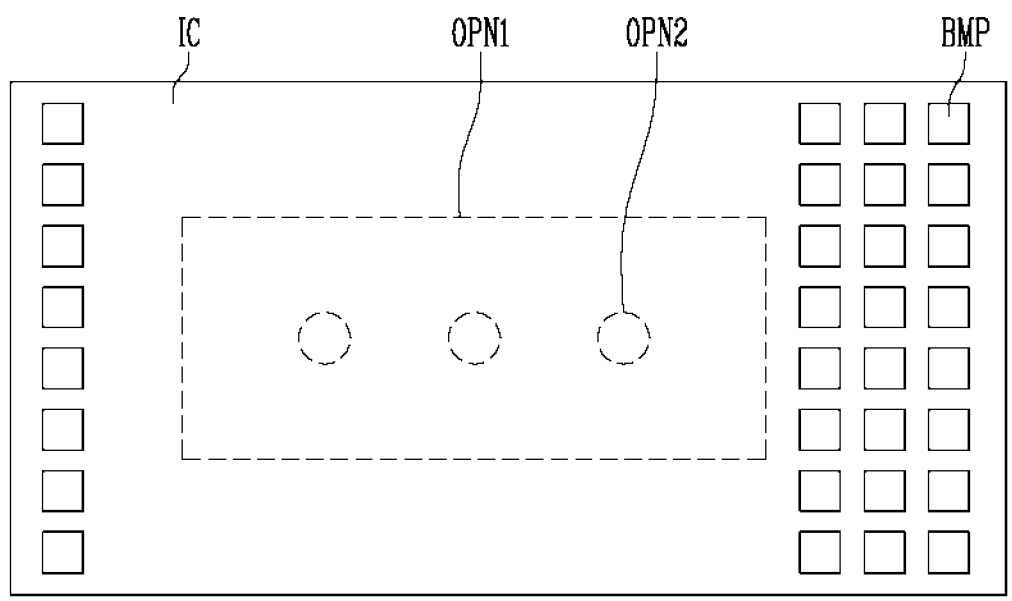
FIG. 4 is a plan view of a circuit chip in a state in which it is adsorbed to a main body.

FIG. 4 is a plan view of the circuit chip IC in a state in which it is adsorbed to the main body BP.

Referring to FIG. 4, regions at where the first opening OPN1 and the second openings OPN2 are provided are illustrated by dashed lines. In FIG. 4, when viewed on a plane, the region at where the first opening OPN1 and the second openings OPN2 are provided (e.g., a region of the circuit chip IC at where the first opening OPN1 and the second openings OPN2 contact the circuit chip IC) is different from (e.g., is offset from) a region or regions at where the bumps BMP are provided.

When viewed on the plane in the state in which the circuit chip IC is adsorbed to the connecting device, the region at where the first opening OPN1 and the second openings OPN2 are provided may be different from the region(s) at where the bumps BMP are provided. For example, when viewed on the plane, the region at where the connecting device adsorbs the circuit chip IC and the region(s) at where the bumps BMP are provided may not overlap each other. If the region at where the connecting device adsorbs the circuit chip IC and the region(s) at where the bumps BMP are provided overlap each other, sufficient pressure may not be provided to the bump(s) BMP that are at an overlapping region. Thus, the bump(s) BMP that are in the overlapping region may be incompletely connected with a pad part PAD (e.g., a pad) on a substrate PNL in a subsequent connecting step using the vibration. Further, if insufficient pressure acts on the bump(s) BMP that are in the overlapping region, excessive pressure may act on the other bumps BMP. A portion or group of the bumps BMP that are subjected to excessive pressure may be broken or damaged during the connecting process, thus generating fine particles. The fine particles may gather on the adsorption surface GS of the main body BP, particularly around the first opening OPN1. The fine particles gathered on the adsorption surface GS of the main body BP may form an uneven portion of the adsorption surface GS of the main body BP to which the circuit chip IC is adsorbed. The uneven portion may damage the circuit chip IC when the circuit chip IC is adsorbed to the adsorption surface GS of the main body BP and is vibrated. Therefore, the connecting device adsorbs a region of the circuit chip IC different from the region(s) at where the bumps BMP are provided, when viewed on a plane, thus preventing or reducing chances of incomplete connection between the bumps BMP and the pad part PAD or damage to the circuit chip IC.

Figure 5A:
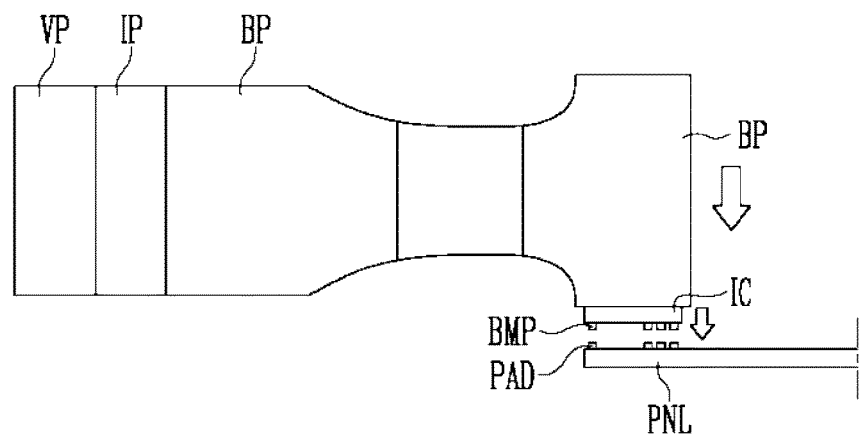
FIGS. 5A-5C are side views sequentially illustrating a circuit chip connecting method according to an embodiment of the present disclosure.
Figure 5B:
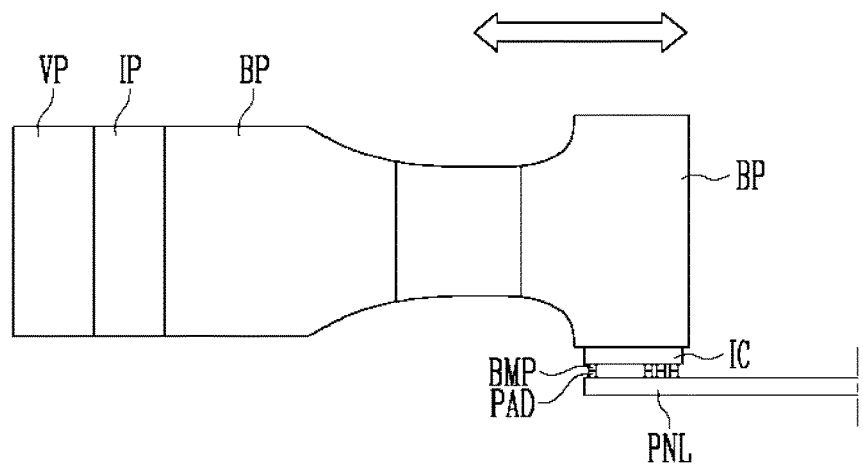
Figure 5C:
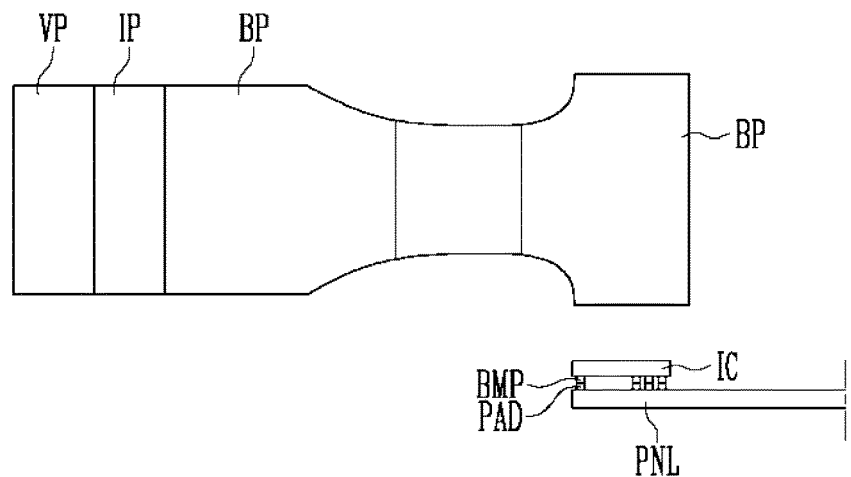

FIGS. 5A-5C are side views sequentially illustrating a circuit chip connecting method according to an embodiment of the present disclosure.

The connecting method according to an embodiment of the present disclosure may include sucking the circuit chip IC and adsorbing the circuit chip IC onto the connecting device, moving the connecting device such that the circuit chip IC comes into contact with the pad part PAD of the substrate PNL, and vibrating the connecting device and the circuit chip IC to connect the circuit chip IC to the pad part PAD of the substrate PNL.

Further, the connecting device for connecting the circuit chip IC and the substrate PNL may include the main body BP having the first and second openings OPN1 and OPN2 open at a surface (e.g., the adsorption surface GS) to which the circuit chip IC is adsorbed, the vibration part VP coupled with the main body BP to vibrate the main body BP, and the intake part IP coupled with the first and second openings OPN1 and OPN2 to adsorb the circuit chip IC to the main body BP. When viewed on a plane, the second opening(s) OPN2 may be provided in the first opening OPN1.

The substrate PNL may be a display panel. The display panel may include a display region in which pixels are provided and a non-display region on a side of (e.g., around a periphery of) the display region. Various wirings connected with the pixels and the pad part PAD may be provided in the non-display region. The pad part PAD may receive the input signal and/or the output signal from the bumps BMP and then transmit the signal to the pixels. A plurality of pad parts PAD may be provided on the substrate PNL. The pad parts PAD may include an output pad and an input pad respectively corresponding to an output bump BMP and an input bump BMP of the circuit chip IC.

Further, the pad part PAD may include an insulator and a conducting layer surrounding the insulator. The insulator may include (or may be) an elastic material to allow the circuit chip IC and the substrate PNL to be stably connected to each other. Thus, even when a relative position between the circuit chip IC and the substrate PNL changes, the connection between the circuit chip IC and the substrate PNL may be stably maintained to some extent. The elastic material may be polyethylene (PE), polypropylene (PP), polystyrene (PS), polyvinyl chloride (PVC), polyester, polyurethane (PU), polyamide, polybutadiene, polyimide (PI) and/or other suitable materials and is not limited to a specific material. Further, the conducting layer included in the pad part PAD may include (or may be) a highly conductive material to electrically connect the circuit chip IC to the substrate PNL. Thus, the conducting layer may include (or may be formed of) a conductive material, such as metal, a conductive resin, or a resin-metal composite material. For example, the conducting layer may include gold (Au), lead (Pb), copper (Cu), etc.

In the connecting method according to an embodiment of the present disclosure, the circuit chip IC is first adsorbed onto the connecting device. As described above, the circuit chip IC may be adsorbed onto the connecting device by the adsorbing force resulting from a difference in atmospheric pressure due to a vacuum created in the first opening OPN1 and/or the second opening(s) OPN2.

The adsorbed circuit chip IC is moved to come into contact with the pad part PAD of the substrate PNL. In the state in which the bumps BMP and the pad part PAD are in contact with each other, the connecting device and the circuit chip IC are vibrated. As described above, the connecting device and the circuit chip IC may be vibrated by the vibration part VP. The circuit chip IC and the substrate PNL may be connected to each other due to the vibration of the circuit chip IC. For example, the bumps BMP on the circuit chip IC and the pad part PAD on the substrate PNL may be connected to each other. Due to the vibration of the bumps BMP, a diffusion layer is formed between the pad part PAD and the bumps BMP. This diffusion layer acts as a bridge between the bumps BMP and the pad part PAD. In addition, the conducting layer on the surface of the bumps BMP and the conducting layer on the surface of the pad part PAD are diffused to make the diffusion layer so that it is electrically conductive. Therefore, the bumps BMP and the pad part PAD may be electrically connected to each other via the diffusion layer.

A depth direction of the first opening OPN1 may be perpendicular to a vibration direction of the main body BR For example, when the depth direction of the first opening OPN1 is vertical with respect to the ground, the vibration direction of the main body BP may be horizontal with respect to the ground. In addition, the vibration direction of the main body BP may be parallel to the substrate PNL. Because the main body BP vibrates in the above-described direction, vibration energy and/or electric energy may not be wasted regardless of the connection between the bumps BMP and the pad part PAD.

In order to connect the circuit chip IC and the pad part PAD of the substrate PNL to each other, the connecting device may be vibrated at a frequency in a range of about 20 KHz to about 200 MHz. If the frequency of the connecting device is less than about 20 KHz, the diffusion layer may not be sufficiently formed between the bumps BMP and the pad part PAD. This may cause a contact failure between the bumps BMP and the pad part PAD. If the frequency of the connecting device is greater than about 200 MHz, the circuit chip IC may break during the connecting process.

According to the related art, an anisotropic conductive film is inserted between the bumps BMP and the pad part PAD to electrically connect the bumps BMP with the pad part PAD. The anisotropic conductive film includes a conductive ball and an insulator. When high pressure and heat are applied to the anisotropic conductive film, the insulator melts to act as a bridge between the pad part PAD and the bumps BMP. The conductive ball included in the anisotropic conductive film is provided between the pad part PAD and the bumps BMP to electrically connect them. Such a method is problematic in that each of the pad part PAD and the bumps BMP is in point contact with the conductive ball, so the resulting electrical connection is relatively unstable. Further, the connecting process using the anisotropic conductive film requires relatively high pressure and high temperature, causing an increase in processing cost.

As described above, in the connecting method according to embodiments of the present disclosure, an anisotropic conductive film may be omitted and high temperature is not necessary to melt a resin in an anisotropic conductive film. Therefore, the connecting method according to embodiments of the present disclosure may reduce processing cost. Moreover, the connecting method according to embodiments of the present disclosure may couple the bumps BMP and the pad part PAD to each other merely by vibrating for about one second. Therefore, according to embodiments of the present disclosure, an overall process time is reduced, thus leading to an increase in processing efficiency.

Example embodiments have been disclosed herein, and although specific terms are employed, they are used and are to be interpreted in a generic and descriptive sense and not for purpose of limitation. In some instances, as would be apparent to one of ordinary skill in the art as of the effective filing date of the present application, features, characteristics, and/or elements described in connection with one embodiment may be used singly or in combination with features, characteristics, and/or elements described in connection with other embodiments unless otherwise specifically indicated. Accordingly, it will be understood by those of ordinary skill in the art that various changes in form and details may be made to the described embodiments without departing from the spirit and scope of the present disclosure as set forth in the following claims and their equivalents.

What is claimed is:

1. A connecting device for connecting a circuit chip to a substrate, the connecting device comprising:
    a main body having a first opening and a second opening, the second opening having a smaller area than that of the first opening and being arranged in the first opening on a plane parallel to a distal end of the first opening, a distal end of each of the first and second openings being at a same surface to which the circuit chip is adsorbed;
    a vibration part on the main body, the vibration part being configured to vibrate the main body; and
    an intake part coupled with the first and second openings to adsorb the circuit chip to the main body.

2. The connecting device according to claim 1, wherein the first opening has a smaller surface area than that of the circuit chip.

3. The connecting device according to claim 2, wherein the first opening has the same shape as that of the circuit chip.

4. The connecting device according to claim 1, wherein the first opening has a major axis and a minor axis, and
    wherein, when the circuit chip is adsorbed to the main body, a major axis of the circuit chip is parallel to the major axis of the first opening.

5. The connecting device according to claim 1, wherein a plurality of the second openings is in the first opening.

6. The connecting device according to claim 5, wherein the first opening has a major axis and a minor axis, and
    wherein ones of the plurality of the second openings are arranged along the major axis of the first opening.

7. The connecting device according to claim 5, wherein a number of the second openings is in a range from one to fifteen.

8. The connecting device according to claim 1, wherein the second opening extends along the main body to be coupled with the intake part.

9. The connecting device according to claim 1, wherein a depth of the second opening is greater than a depth of the first opening.

10. The connecting device according to claim 1, wherein the vibration part is configured to vibrate the main body in a vibration direction, and
    wherein a depth direction of the first opening is perpendicular to the vibration direction.

11. The connecting device according to claim 1, wherein, when the circuit chip is adsorbed to the main body, the second opening is in a vacuum state due to suction from the intake part.

12. A connecting device for connecting a circuit chip to a substrate, the connecting device comprising:
    a vacuum source;
    a transducer configured to vibrate at a predetermined frequency; and
    a horn coupled to the transducer to be vibrated by the transducer, the horn having an adsorption surface configured to contact the circuit chip, the adsorption surface having a first opening and a plurality of supplemental intake tubes, the first opening having a major axis and a minor axis, being open at the adsorption surface, and being in fluid communication with the vacuum source, the plurality of supplemental intake tubes being arranged in and extending through the major axis of the first opening, being open at the adsorption surface, and being in fluid communication with the vacuum source.

13. The connecting device according to claim 12, wherein openings of the supplemental intake tubes are offset from the first opening at the adsorption surface in a direction perpendicular to a vibration direction of the transducer.

* * * * *